United States Patent [19]
Loh et al.

[11] Patent Number: 5,340,761
[45] Date of Patent: Aug. 23, 1994

[54] SELF-ALIGNED CONTACTS WITH GATE OVERLAPPED LIGHTLY DOPED DRAIN (GOLDD) STRUCTURE

[75] Inventors: Ying T. Loh, Saratoga; Chung S. Wang, Fremont, both of Calif.

[73] Assignee: VLSI Technology, Inc., San Jose, Calif.

[21] Appl. No.: 786,321

[22] Filed: Oct. 31, 1991

[51] Int. Cl.⁵ .................. H01L 21/336; H01L 21/28
[52] U.S. Cl. ...................... 437/44; 437/186; 437/189; 437/192; 437/193; 437/200
[58] Field of Search ............ 437/44, 186, 189, 192, 437/193, 200

[56] References Cited

U.S. PATENT DOCUMENTS

| | | | |
|---|---|---|---|
| 4,127,931 | 12/1978 | Shiba | 437/186 |
| 4,285,117 | 8/1981 | Heeren | 437/186 |
| 4,352,238 | 10/1982 | Shimbo | 437/186 |
| 4,506,437 | 3/1985 | Godejahn, Jr. | 437/186 |
| 4,740,484 | 4/1988 | Norström et al. | 437/44 |
| 5,053,849 | 10/1991 | Izawa et al. | 437/44 |

OTHER PUBLICATIONS

J. E. Moon, et al., "A New LDD Structure: Total Overlap with Polysilicon Spacer (TOPS)", IEEE Electronic Device Letters, May 1990, pp. 221-223.
T. Y. Huang: "A novel SubMicron LDD Transistor with Inverse-T Gate Structure", IEDM, 1986, pp. 742-745.
R. Izawa, et al., "The Impact of Gate-Drain Overlapped LDD(GOLD) For Deep SubMicron VLSIs", IEDM, 1987, pp. 38-41.

*Primary Examiner*—Mary Wilczewski
*Attorney, Agent, or Firm*—Douglas L. Weller

[57] ABSTRACT

In a method for producing a transistor with an overlapping gate region, a gate region is placed on a substrate between two source/drain regions. Spacers are placed around the gate region. The spacers are formed of dielectric material. A thin layer of polysilicon is deposited over the two source/drain regions and over electrically insulating regions adjacent to the two source/drain regions. Portions of the thin layer of polysilicon are oxidized to electrically isolate the two source/drain regions. A metal-silicide layer is formed on the portions of the thin layer of polysilicon which are not oxidized. The metal-silicide layer is connected to a metal layer. The electrical contact of the metal-silicide layer and the metal layer is over an electrically insulating layer.

10 Claims, 4 Drawing Sheets

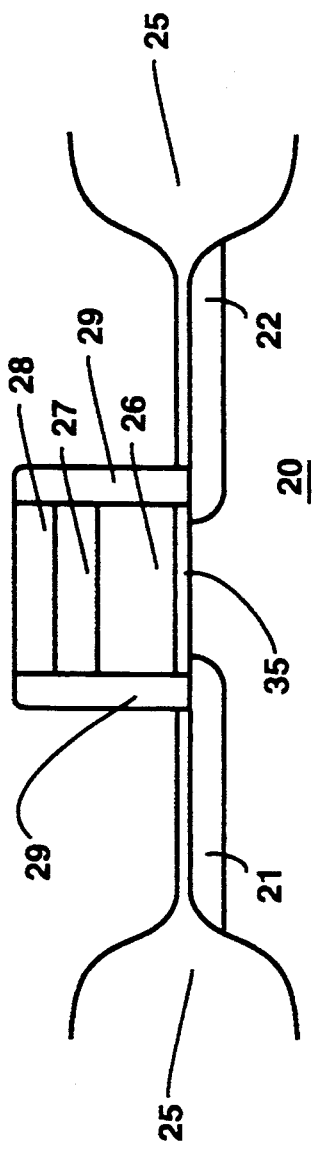
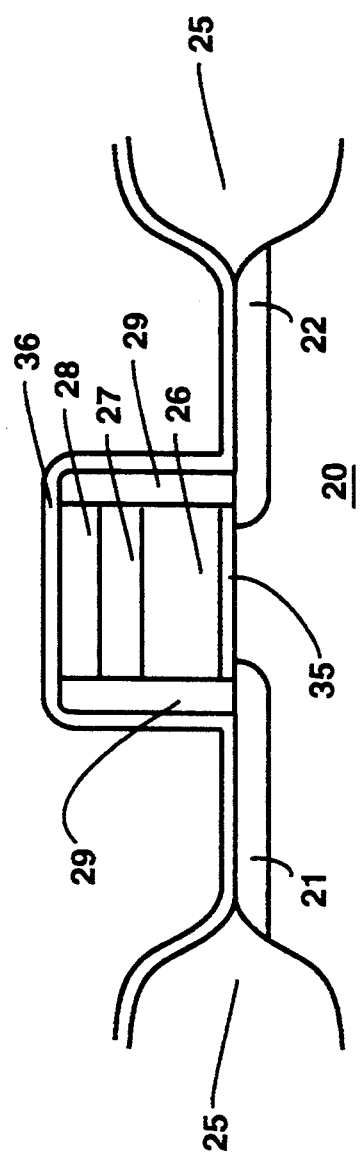

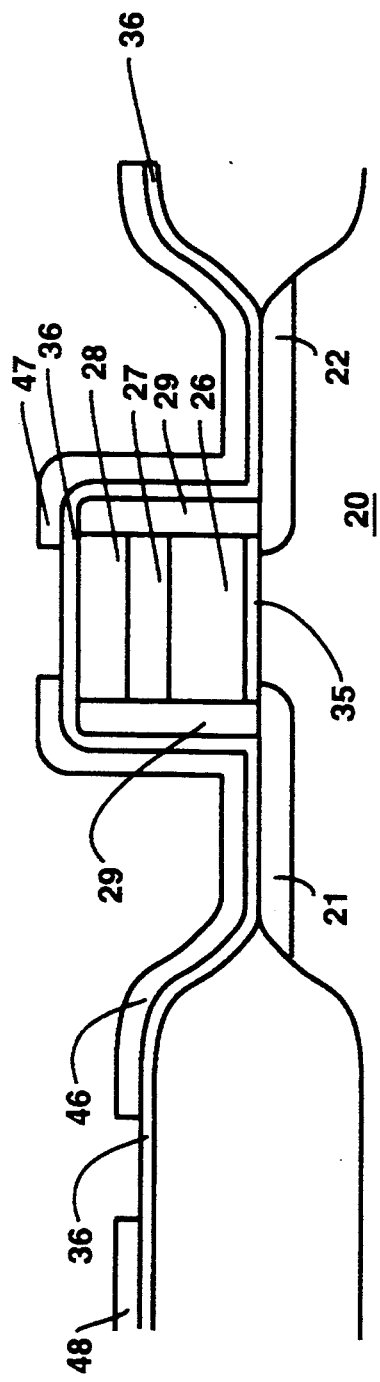
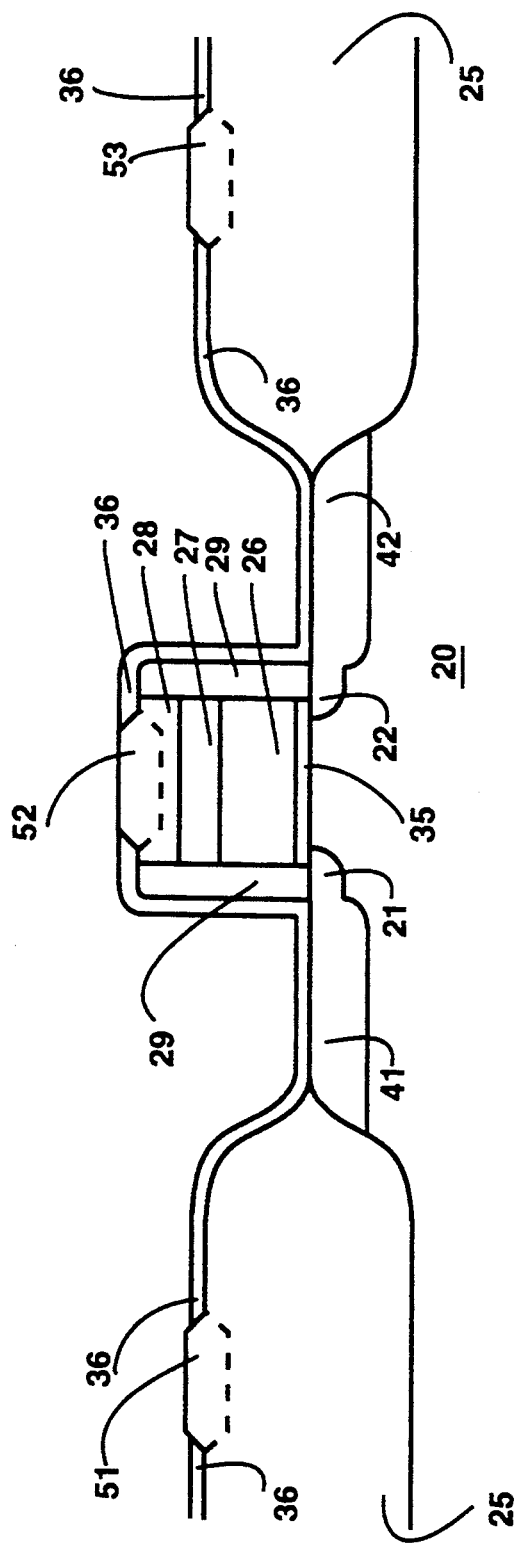

SELF-ALIGNED CONTACTS WITH GATE OVERLAPPED LIGHTLY DOPED DRAIN (GOLDD) STRUCTURE

BACKGROUND

The present invention concerns a gate overlapped lightly doped drain (GOLDD) process for use in producing high reliability submicron metal oxide semiconductor field effect transistors (MOSFETs).

The use of GOLDD processes for high speed reliable submicron MOSFETs has been investigated. For example, in one process, referred to as total overlap with polysilicon spacer (TOPS), three deposits of polysilicon are use to form a gate region of a transistor which overlaps the source and drain region of the transistor. See J. E. Moon, et al., *A New LDD Structure: Total Overlap with Polysilicon Spacer (TOPS)*, IEEE Electronic Device Letters, May 1990, pp. 221–223. See also T. Y Huang: *A novel SubMicron LDD Transistor with Inverse-T Gate Structure*, IEDM, 1986, pp. 742–745, and R. Izawa, et. al., *The Impact of Gate-Drain Overlapped LDD(GOLD) For Deep SubMicron VLSIs*, IEDM 1987, pp. 38–41.

The presence of an overlapping gate in submicron processing of MOSFETs has several advantages. For example, devices which use overlapping gates show improvements in performance and reliability. Further, such devices have shown a smaller sensitivity to $n^-$ dose variations. However, existing GOLDD processes are complex and not suitable for use in a volume production environment. For example, the three polysilicon depositions required for the TOPS process makes the process impractical for use in manufacturing VLSI circuits. It is desirable, therefore, to develop methods to produce MOSFETs using GOLDD processes which are also suitable for use in a manufacturing environment.

SUMMARY OF THE INVENTION

In accordance with the preferred embodiment of the present invention, a method is presented for producing a transistor with an overlapping gate region. A gate region is placed on a substrate between two source/drain regions. In the preferred embodiment the gate region is formed by depositing a first polysilicon layer on top of a dielectric region. A metal-silicide layer is deposited over the polysilicon layer. Alternately, the gate region may be composed entirely of polysilicon. An oxide is formed (i.e., grown or deposited) on top of the metal-silicide layer (or on top of the polysilicon layer if there is no metal-silicide layer). The first polysilicon layer, the metal-silicide layer and the oxide on top of the metal-silicide layer are then masked and etched to form the gate region.

In the preferred embodiment, atoms of a first conductivity type are implanted into the two source/drain regions. For example, the implant into the two source/drain regions may be an $n^-$ implant using Phosphorus atoms. Alternately, this implant may be an $p^-$ implant using Boron atoms. Spacers are placed around the gate region. The spacers are formed of dielectric material, for example, chemical vapor deposition (CVD) oxide or nitride.

A thin layer of polysilicon is deposited over the whole wafer including the two source/drain regions and the electrically insulating regions adjacent to the two source/drain regions. In the preferred embodiment, the thin layer of polysilicon is implanted with atoms of a first conductivity type, for example, an $n^+$ implant using Arsenic. Alternately this implant may be a $p^+$ implant using Boron.

Portions of the thin layer of polysilicon are oxidized to electrically isolate the two source/drain regions. The oxidation may be done, for example by depositing a layer of nitride over the thin layer of polysilicon, patterning and etching the layer of nitride to expose portions of the thin layer of polysilicon, performing a high pressure oxidation to oxidize exposed portions of the thin layer of polysilicon, and stripping away the layer of nitride. Alternate to high pressure oxidation, a thermal oxidation may be used to achieve oxidation.

A metal-silicide layer is formed on the portions of the thin layer of polysilicon which are not oxidized. This may be done, for example, by depositing a metal layer on the wafer and performing a rapid thermal anneal on the metal layer. During the rapid thermal anneal, the metal layer will react with the portions of the thin layer of polysilicon which are not oxidized to produce a metal-silicide layer. Unreacted portions of the metal layer are stripped away leaving the metal-silicide layer. The metal-silicide layer is connected to a connection metal layer through contact holes. The electrical contact of the metal-silicide layer and the connection metal layer is over the electrically insulating layer. For example, the metal-silicide may be Titanium-silicide. The metal used for the metal-silicide layer may alternately consist of, for example, Molybdenum (Mo), Chromium (Cr), Nickel (Ni), Platinum (Pt), Cobalt (Co), or Tantalum (Ta).

The present invention has several advantages over the prior art. For example, the presented method is simple, practical and fully compatible with current VLSI processes. A low gate resistance is produced by using a polycide gate. Further, the source/drain region may be reduced in size because of the extended electrode over the field oxide region. This will result in a smaller circuit area. The use of extended electrodes also prevents plasma etch damage to the junction and provides better junction performance with respect to breakdown and leakage. Further breakdown voltage (BV) is improved because there is no heavy implant to the source/drain regions. The metal-silicide used for connection to the source/drain results in low source/drain sheet resistance and low contact resistance. Also, low source/drain junction capacitance is achieved by the reduction in size of the active source/drain and the shallowness of the source/drain regions.

BRIEF DESCRIPTION OF THE DRAWINGS

FIG. 2 through FIG. 6 illustrate a method for producing a gate overlapped lightly doped drain MOSFET in accordance with the preferred embodiment of the present invention.

DESCRIPTION OF THE PRIOR ART

Figure 1:
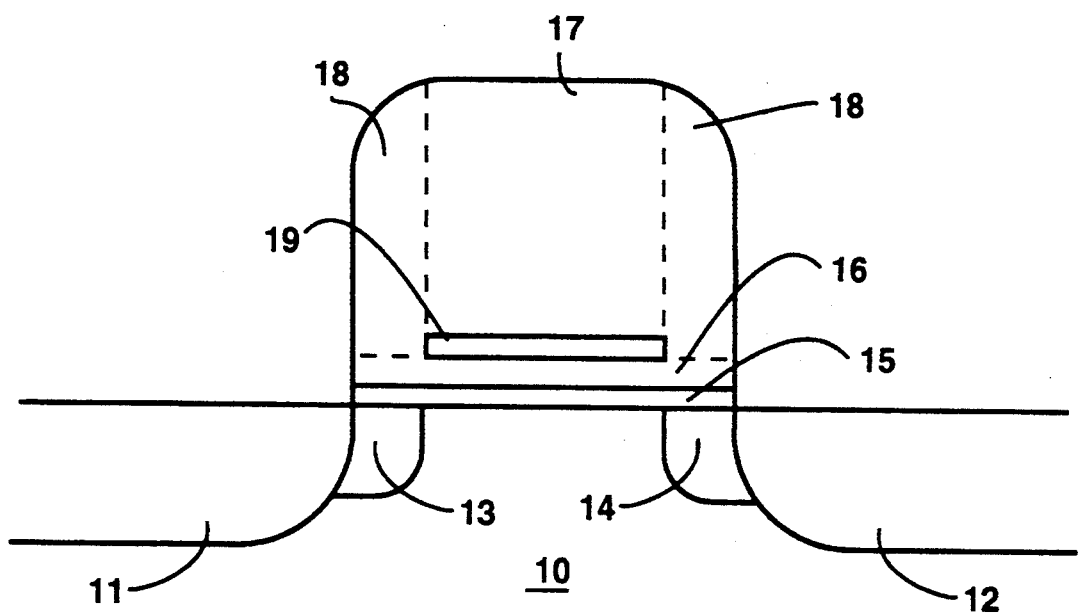
FIG. 1 illustrates a prior art process in which three polysilicon deposits are used to produce a gate overlapped lightly doped drain MOSFET.

FIG. 1 shows a structure resulting from a prior art TOPS process. Within a substrate 10 is implanted an $n^+$ region 11, an $n^+$ region 12, an $n^-$ region 13 and an $n^-$ region 14. A gate region is placed on top of an oxide layer 15. Oxide layer 15 is on top of substrate 10. The gate region was constructed using a first polysilicon deposition to form a polysilicon region 16, a second polysilicon deposition to form a polysilicon region 17 and a third polysilicon deposition to form a polysilicon region 18. A thin oxide region 19 is buried within the gate region as shown.

The shown structure has improved performance and reliability over oxide spacer lightly doped drain devices (LDD). Further, devices using the above-described structure have shown a smaller sensitivity to n− dose variations. However, as discussed above, in the TOPS process, three deposits of polysilicon are use to form the gate region. The three polysilicon depositions makes the process impractical for use in manufacturing VLSI circuits.

DESCRIPTION OF THE PREFERRED EMBODIMENT

FIG. 2 through FIG. 6 illustrate a method for producing a gate overlapped lightly doped drain MOSFET in accordance with a preferred embodiment of the present invention.

The structure shown in FIG. 2 is formed in a well 20 of first conductivity type within a substrate. For example, the substrate may be of p-type material doped with $10^{15}$ atoms per cubic centimeter. Alternately, the substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A first gate region 26 is formed on gate oxide layer 35 using a mask and etch process. Typically, first gate region 26 has a width which is less than or equal to 0.8 microns. First gate region 26 may be made of polysilicon, for example, doped with n-type atoms at $10^{20}$ atoms per cubic centimeter. While the gate may be formed entirely of polysilicon, in the preferred embodiment of the present invention the gate is a polycide. A second gate region 27 of metal-silicide is formed on first gate region 26. A cap oxide region 28 is formed on top of second gate region 27. A typical thickness for polysilicon region 28 is 0.2 microns. A typical thickness for metal-silicide region 27 is 0.2 microns. A typical thickness for cap oxide region 28 is 0.1 microns. In the preferred embodiment, Titanium (Ti) is used to form the metal-silicide layer. Other metals may be used such as, for example, Molybdenum (Mo), Chromium (Cr), Nickel (Ni), Platinum (Pt), Cobalt (Co), or Tantalum (Ta).

The gate regions may be formed as follows. A layer of polysilicon is deposited over the layer of gate oxide 35. For example, the deposition may be a chemical vapor deposition (CVD). The polysilicon is doped using $POCl_3$. Alternately, an implant of Phosphorus or Arsenic atoms may be used. A metal-silicide layer is formed on top of the polysilicon layer, for example by chemical vapor deposition or sputtering. For example, the metal-silicide may be Titanium-silicide. The metal used for the metal-silicide layer may alternately consist of, for example, Tungsten (W) Molybdenum (Mo), Chromium (Cr), Nickel (Ni), Platinum (Pt), Cobalt (Co), or Tantalum (Ta). On top of the resulting metal-silicide layer region there is placed a dielectric layer. The dielectric layer may be placed, for example, using chemical vapor deposition (CVD) of oxide. Using a mask, an etch is performed on both sides of region 26, 27 and 28. The mask and etch exposes the gate oxide layer on top of the substrate.

On the sides of gate region 26 and gate region 27 are implanted a region 21 and a region 22 of second conductivity type. Region 21 and region 22 act as source/drain regions for a transistor. For example, region 21 and region 22 are n− regions doped with Phosphorus at $10^{17}$ atoms per cubic centimeter. Region 21 and region 22 extend 0.15 micrometers below the surface of the substrate. Alternately, region 21 and region 22 may be p− regions. Region 21 is separated from region 22 by, for example, 0.8 microns or less.

The exposed portions of the gate oxide layer 35 are dipped off using, for example, a fifty to one mixture of $H_2O$ and HF. A dielectric region 29 is then formed surrounding the gate. Dielectric region 29 is formed, for example, by chemical vapor deposited oxide or nitride, followed by an etch back to form the spacer structure shown in FIG. 2. The thickness of dielectric region 29 is, for example, 0.3 microns.

A thin polysilicon layer 36 is deposited over the substrate. Polysilicon layer 36 is, for example, deposited using chemical vapor deposition (CVD) and is between 700 Å and 1000 Å thick. A mask/implant is used to dope polysilicon layer 36 to be of the second conductivity type. For example, polysilicon layer 36 is doped using an n+-type conductivity mask to a doping density of $10^{20}$ atoms per cubic centimeter. The resultant structure is shown in FIG. 3.

A nitride layer is deposited over polysilicon layer 36. For example, the nitride layer is deposited by chemical vapor deposition and is approximately 0.1 microns thick. The nitride layer is patterned and etched out so that a portion 46 of the nitride layer which covers source/drain region 21 is completely separate from a portion 47 of the nitride layer which covers source/drain region 22. Portion 46 and 47 are also separated from other portions of the nitride layer, such as a portion 48 of the nitride layer. The result is shown in FIG. 4.

As shown in FIG. 4, where the nitride layer is etched, polysilicon layer 36 is exposed. A high pressure oxidation is used to completely oxidize the exposed portions of polysilicon layer 36 to form, for example, an oxidized portion 51, an oxidized portion 52 and an oxidized portion 53. For example, the wafer may be heated to 900 degrees Celsius at 10 atmospheres for a duration of 10 minutes. Alternately, a conventional thermal oxidation may be used to oxidize the exposed portions of polysilicon layer 36. The nitride layer is then stripped away using, for example, hot phosphoric acid at 160 degrees Celsius for sixty minutes. During the high pressure oxidation and any subsequent oxidation/annealing cycles, the doping the polysilicon layer 36 will out diffuse to form a diffusion junction 41 in source/drain region 21 and a diffusion junction 42 in source/drain region 22. In the preferred embodiments of the present invention diffusion junction 41 and diffusion junction 42 will be n+ junctions. Alternately, polysilicon layer 35 may be doped with P-type conductivity atoms (e.g. Boron) and diffusion junction 41 and diffusion junction 42 will then be p+ junctions. The result is shown in FIG. 5.

A metal-silicide layer 66 is formed over polysilicon layer 36. Metal-silicide layer 66 is formed as follows. A metal layer is deposited over the substrate. The metal layer is, for example, composed of Titanium and has a thickness of approximately 0.05 microns to 0.1 microns. Alternately, the metal layer may consist of another metal such as, for example, Molybdenum (Mo), Chromium (Cr), Nickel (Ni), Platinum (Pt), Cobalt (Co), or Tantalum (Ta). The thickness of the metal layer will depend upon the metal used. For Titanium, once deposited, a rapid thermal anneal of, for example, fifteen seconds at 700 degrees Celsius is performed to create a self-aligned reaction of the Titanium layer with polysilicon layer 36. The unreacted metal is stripped away, for example using a mixture of $NH_4OH$, $H_2O_2$ and $H_2O$. The remaining metal-silicide layer 66 is shown in FIG. 6.

Figure 6:
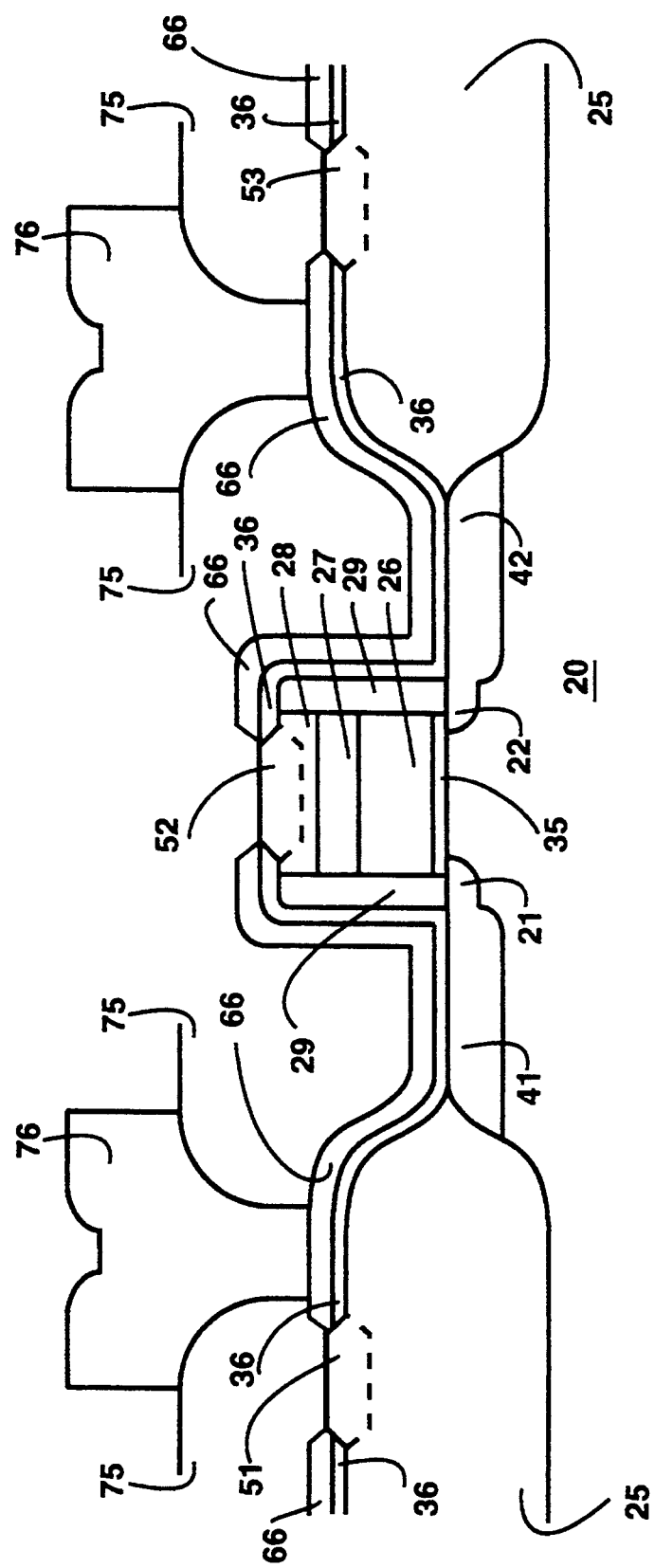

As further shown in FIG. 6, an insulating layer 75 of a BPSG layer on top of a TEOS layer are deposited over the wafer. For example, the TEOS layer is 0.15 microns and the BPSG layer is 0.4 microns. Insulating layer 75 is masked and etched to produce connection holes. A metal layer 76 is then deposited in contact with metal-silicide layer 66 through the connection holes, as shown. Since connection holes for metal layer 76 are located over insulating layer 25, and not over source/drain region 21 and source/drain region 22, the size of source/drain region 21 and source/drain region 22 can each be shrunk to have a length less than the misalignment tolerance ($\lambda$) between the contact and diffusion mask layers. For example, in a typical process, the length of source/drain region 21 and source/drain region 22 can be reduced to approximately 0.5 microns.

The present invention has several advantages over the prior art processes. For example, the present invention provides for a method which is simple, practical and fully compatible with current VLSI processes. The present invention utilizes self-aligned silicidation to produce a GOLDD structure which has a low gate resistance. Further, the use of an extended electrode over the field oxide regions allows the source/drain region to be reduced in size, prevents plasma etch damage to the junction and provides better junction performance with respect to breakdown and leakage. Also, in the present invention there is no heavy implant to source/drain region 21 or source/drain regions 22. This results in an improved break down voltage (BV). The use of the metal-silicide for connection to the source/drain results in low source/drain sheet resistance and low contact resistance. Finally, the reduction in size of the active source/drain, the extreme shallowness of source/drain region 21 and source/drain region 22 and shallowness of source/drain region 41 and source/drain region 42 result in low source/drain junction capacitance.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing a transistor with an overlapping gate region, the method comprising the steps of:
   (a) placing on a substrate between two source/drain regions, a gate region which includes a polysilicon region, the gate region being placed on top of a dielectric region; the polysilicon region being used as part of a gate region;
   (b) forming spacers around the gate region, the spacers being composed of dielectric material; and,
   (c) forming a thin layer of polysilicon over the two source/drain regions and over electrically insulating regions adjacent to the two source/drain regions;
   (d) oxidizing portions of the thin layer of polysilicon to electrically isolate the two source/drain regions;
   (e) forming a metal-silicide layer on the portions of the thin layer of polysilicon which are not oxidized; and,
   (f) connecting the metal-silicide layer to a metal layer through a contact hole, an electrical contact of the metal-silicide layer and the metal layer being over the electrically insulating layer.

2. A method as in claim 1 wherein step (a) includes the following substeps:
   (a.1) depositing a first polysilicon layer;
   (a.2) forming a metal-silicide layer over the polysilicon layer;
   (a.3) forming an oxide on top of the metal-silicide layer; and,
   (a.4) masking and etching the first polysilicon layer, the metal-silicide layer and the oxide on top of the metal-silicide layer to form the gate region.

3. A method as in claim 1 wherein before step (b), the following step is performed:
   (g) implanting atoms of a first conductivity type into the two source/drain regions.

4. A method as in claim 3 wherein the first conductivity type is n-type conductivity.

5. A method as in claim 3 wherein before step (d) the following step is performed:
   (h) implanting atoms of a first conductivity type into the thin layer of polysilicon.

6. A method as in claim 5 wherein in step (h) n+-type atoms are implanted.

7. A method as in claim 1 wherein step (d) includes the substeps of:
   (d.1) depositing a layer of nitride;
   (d.2) patterning and etching the layer of nitride to expose portions of the thin layer of polysilicon;
   (d.3) oxidizing the exposed portions of the thin layer of polysilicon; and,
   (d.4) stripping away the layer of nitride.

8. A method as in claim 1 wherein step (e) comprises the substeps of:
   (e.1) depositing a metal layer;
   (e.2) performing a rapid thermal anneal on the metal layer deposited in step (e.1) to form the metal-silicide layer over the portions of the thin layer of polysilicon which are not oxidized; and,
   (e.3) stripping off unreacted portions of the metal layer.

9. A method as in claim 8 wherein the metal in the metal layer is titanium.

10. A method as in claim 1 wherein before step (c) residual gate oxide over the two source/drain regions is dipped off.

* * * * *